United States Patent
Poirot-Crouvezier et al.

(10) Patent No.: US 10,162,012 B2
(45) Date of Patent: Dec. 25, 2018

(54) DETERMINING OF A SPATIAL DISTRIBUTION OF THE ELECTRICAL CONTACT RESISTANCE OF AN ELECTROCHEMICAL CELL

(71) Applicant: Commissariat A L'Energie Atomique et aux Energies Alternatives, Paris (FR)

(72) Inventors: Jean-Philippe Poirot-Crouvezier, Saint Georges de Commiers (FR); Fredy-Intelligent Nandjou Dongmeza, Grenoble (FR); Christophe Robin, Grenoble (FR); Mathias Gerard, Grenoble (FR); Fabrice Micoud, La Buisse (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 15/271,732

(22) Filed: Sep. 21, 2016

(65) Prior Publication Data

US 2017/0082696 A1    Mar. 23, 2017

(30) Foreign Application Priority Data

Sep. 21, 2015  (FR) .................................... 15 58894

(51) Int. Cl.
*G01R 31/36*   (2006.01)
*C25B 15/02*   (2006.01)
(Continued)

(52) U.S. Cl.
CPC .......... *G01R 31/3662* (2013.01); *C25B 15/02* (2013.01); *G01R 31/3675* (2013.01);
(Continued)

(58) Field of Classification Search
USPC ..... 324/430–434; 429/7, 427, 434, 442, 452
See application file for complete search history.

(56) References Cited

U.S. PATENT DOCUMENTS

| 4,567,117 A | 1/1986 | Patel et al. |
| 2004/0247991 A1 | 12/2004 | Suzuki |

(Continued)

FOREIGN PATENT DOCUMENTS

| EP | 2 924 793 A1 | 9/2015 |
| FR | 2 976 732 A1 | 12/2012 |

(Continued)

OTHER PUBLICATIONS

French Preliminary Search Report dated Aug. 3, 2016 in French Application 15 58894, filed Sep. 21, 2015 ( with English Translation of Categories of cited documents & Written Opinion ).

(Continued)

*Primary Examiner* — Vincent Q Nguyen
(74) *Attorney, Agent, or Firm* — Oblon, McClelland, Maier & Neustadt, L.L.P.

(57) ABSTRACT

A method for determining a spatial distribution ($Rc_{x,y}^f$) of a parameter of interest (Rc) representative of a contact resistance between a bipolar plate and an adjacent electrode of an electrochemical cell, in which a spatial distribution ($Rc_{x,y}^f$) of the parameter of interest (Rc) is determined depending on the spatial distribution ($Q_{x,y}^e$) of a second thermal quantity ($Q^e$) estimated beforehand from the spatial distribution ($T_{x,y}^c$) of a set-point temperature (Tc) and from the spatial distribution ($D_{x,y}^r$) of a first thermal quantity ($D^r$).

12 Claims, 8 Drawing Sheets

(51) Int. Cl.
H01M 8/0432 (2016.01)
H01M 8/04537 (2016.01)
H01M 8/04701 (2016.01)
H01M 8/04858 (2016.01)
H01M 8/241 (2016.01)
H01M 8/0247 (2016.01)
H01M 8/0265 (2016.01)
H01M 8/0267 (2016.01)
H01M 8/04298 (2016.01)
H01M 8/0254 (2016.01)

(52) U.S. Cl.
CPC ....... H01M 8/0247 (2013.01); H01M 8/0265 (2013.01); H01M 8/0267 (2013.01); H01M 8/0432 (2013.01); H01M 8/04305 (2013.01); H01M 8/04574 (2013.01); H01M 8/04641 (2013.01); H01M 8/04701 (2013.01); H01M 8/04902 (2013.01); H01M 8/241 (2013.01); H01M 8/0254 (2013.01)

(56) References Cited

U.S. PATENT DOCUMENTS

| | | | |
|---|---|---|---|
| 2005/0095485 | A1 | 5/2005 | Saulsbury et al. |
| 2007/0292737 | A1* | 12/2007 | Makita ............. H01M 8/04447 429/431 |
| 2007/0298299 | A1 | 12/2007 | Izawa et al. |
| 2008/0020261 | A1 | 1/2008 | Hendricks et al. |
| 2009/0024373 | A1 | 1/2009 | Berning et al. |
| 2009/0317686 | A1* | 12/2009 | Huston ............. H01M 8/0236 429/432 |
| 2010/0297526 | A1 | 11/2010 | Hendricks et al. |
| 2010/0323279 | A1 | 12/2010 | Fujiuchi et al. |
| 2013/0034801 | A1 | 2/2013 | Pavlik et al. |
| 2014/0370416 | A1 | 12/2014 | Alhazmi et al. |

FOREIGN PATENT DOCUMENTS

| | | |
|---|---|---|
| FR | 2 985 610 A1 | 7/2013 |
| JP | 2000-90950 A | 3/2000 |
| JP | 2000-321353 A | 11/2000 |
| JP | 2005-293902 | 10/2005 |
| JP | 2007-323852 | 12/2007 |
| WO | WO 2007/032903 A2 | 3/2007 |
| WO | WO 2012/085245 A1 | 6/2012 |
| WO | WO 2013/088122 A1 | 6/2013 |
| WO | WO 2015/029983 A1 | 3/2015 |

OTHER PUBLICATIONS

French Preliminary Search Report dated Jun. 16, 2016 in French Application 15 58898, filed Sep. 21, 2015 (with English Translation of Categories of cited documents & Written Opinion).

French Preliminary Search Report dated May 12, 2016 in French Application 15 58896, filed Sep. 21, 2015 (with English Translation of Categories of cited documents & Written Opinion).

French Preliminary Search Report dated Aug. 3, 2016 in French Application 15 58895, filed Sep. 21, 2015 (with English Translation of Categories of cited documents & Written Opinion).

Christophe Robin et al. "Development and Experimental validation of a PEM fuel cell 2D-model to study heterogeneities effects along large-area cell surface", International Journal of Hydrogen Energy 40, 2015, 20 pages.

Lara Jabbour et al. "Feasibility of in-plane GDL structuration: Impact on current density distribution in large-area Proton Exchange Membrane Fuel Cells", Journal of Power Sources 299, 2015 11 pages.

Stefan A. Freunberger et al. "Measuring the Current Distribution in PEFCs with Sub-Millimeter Resolution", Journal of the Electrochemical Society 153, 2006, 8 pages.

Sylvie Escribano et al. "Characterization of PEMFCs gas diffusion layers properties", Journal of Power sources 156, 2006, 6 pages.

Vahid Norouzifard et al. "Deformation of PEM fuel cell gas diffusion layers under compressive loading: An analytical approach", Journal of Power sources 264, 2014, 8 pages.

Ahmad El-Kharouf et al "Ex-situ characterization of gas diffusion layers for proton exchange membrane fuel cells", Journal of Power sources 218, 2012, 12 pages.

Eliton Fontana et al "Study of the effects of flow channel with non-uniform cross-sectional area on PEMFC species and heat transfer", International Journal of Heat and Mass Transfer 54, 11 pages, 2011.

Viral Mehta et al "Review and analysis of PEM fuel cell design and manufacturing", Journal of Power Sources 114, 2003, 22 pages.

V. Mishra et al. "Measurement and Prediction of Electrical Contact Resistance Between Gas Diffusion Layers and Bipolar Plate for Applications to PEM fuel Cells", ASME 2004 1 page.

Rajashankar Sadasivam et al. "Fully developed forced convection through trapezoidal and hexagonal ducts", International Journal of Heat and Mass Transfer 42, 1999, 11 pages.

Ha Na Yu et al. Composite endplates with pre-curvature for PEMFC (polymer electrolyte membrane fuel cell), Composite Structures 92, 2010, 6 pages.

Curtis Marr et al. "Composition and Performance modelling of catalyst layer in a proton exchange membrane fuel cell", Journal of Power Sources 77, 1999, 11 pages.

David. P. Wilkinson et al. "In-plane gradients in fuel cell structure and conditions for high performance", Journal of Power sources 113, 2003, 8 pages.

Christophe Robin et al "Developpement d'un modele predictif de duree de vie d'une pile PEMFC pour une application aeronautique:etude des interactions entre le Coeur de pile et les conditions d'operation du systeme", XP055271391, 2015, 3 pages.

Ying Shi et al, "A fractal permeability model for the gas diffusion layer of PEM fuel cells", Journal of Power Sources 160, 2006, 7 pages.

Dahua Shou et al "Effective Permeability of gas diffusion layer in proton exchange membrane fuel cells", International Journal of Hydrogen Energy 38, 2013, 8 pages.

Clemens Fink et al "Three-Dimensional simulation of polymer electrolyte membrane fuel cells with experimental validation" Electrochimica Acta 56, 2011, 12 pages.

Allen Hermann et al "Bipolar plates for PEM fuel cells: A review", International Journal of Hydrogen Energy 30, 2005, 6 pages.

Gen Inoue et al "Numerical Analysis of relative humidity distribution in polymer electrolyte fuel cell stack including cooling water", Journal of Power Sources 162, 2006, 13 pages.

U.S. Office Action dated Apr. 17, 2018 in corresponding U.S. Appl. No. 15/271,606.

Pharoah, J.G. et al., "On the Temperature Distribution in Polymer Electrolyte Fuel Cells", Journal of Power Sources, vol. 195, 2010, pp. 5235-5245.

Office Action dated Oct. 18, 2018 in co-pending U.S. Appl. No. 15/271,669.

* cited by examiner

DETERMINING OF A SPATIAL DISTRIBUTION OF THE ELECTRICAL CONTACT RESISTANCE OF AN ELECTROCHEMICAL CELL

TECHNICAL FIELD

The technical field of the invention is that of electrochemical reactors including a stack of electrochemical cells, such as fuel cell and electrolyzers, and more precisely that of methods for determining a parameter representative of the electrical contact resistance of an electrochemical cell allowing the uniformity of the spatial distribution of the temperature of the cell in operation to be increased, and that of methods for producing an electrochemical reactor or cell.

STATE OF THE PRIOR ART

An electrochemical reactor such as a fuel cell or electrolyzer conventionally includes a stack of electrochemical cells that each comprise an anode and a cathode that are electrically separated from each other by an electrolyte, an electrochemical reaction taking place in each cell between two reactants that are continuously fed thereto. In the case of a hydrogen fuel cell, the fuel (hydrogen) is brought into contact with the anode, and the oxidant (oxygen), which is for example contained in air, is brought into contact with the cathode. The electrochemical reaction is subdivided into two half reactions, an oxidation reaction and a reduction reaction, which take place at the anode/electrolyte interface and at the cathode/electrolyte interface, respectively. To take place, the electrochemical reaction requires the presence of an ionic conductor between the two electrodes, namely the electrolyte, which optionally takes the form of a polymer membrane, and an electronic conductor formed by the external electric circuit. The stack of cells is thus the site of the electrochemical reaction, this requiring the reactive species to be supplied and the products and unreactive species and the heat produced to be removed.

The cells are conventionally separated from one another by bipolar plates that ensure the electrical interconnection of the cells. The plates include a circuit for distributing fuel, formed on an anodic side, and a circuit for distributing oxidant, formed on a cathodic side opposite the anodic side. Each distributing circuit often takes the form of a network of channels for example arranged in parallel or in a serpentine arrangement, said channels being suitable for bringing the reactive species uniformly to the corresponding electrode. The bipolar plates may also include a cooling circuit formed from a network of internal ducts that allow a heat-transfer fluid to flow and thus the heat produced locally during the reaction in the cell to be removed.

Each electrode is conventionally formed from a diffusion layer and an active layer. The diffusion layer is located between the active layer and the corresponding bipolar plate. It is produced from a porous material allowing gaseous reactive species to diffuse as far as the active layer and reactants generated by the electrochemical reaction to diffuse out. The active layer, which is located between the electrolytic membrane and the diffusion layer, is the site of the electrochemical reaction. It generally includes an electronic conductor (for example carbon), a protonic conductor (the electrolyte) and a catalyst, for example platinum particles. It may be formed from a mixture of platinum-coated carbon powder, of PTFE particles and of polymer electrolyte (for example Nafion), said mixture being placed on a carbon fabric corresponding to the diffusion layer.

The stack of electrochemical cells is conventionally placed between two end plates that apply a clamping force, or mechanical load, to the stack via clamping components such as tie bolts, this load allowing on the one hand a suitable sealtightness to be obtained on the border of the electrochemical cells, and on the other hand a satisfactory electrical contact to be obtained between the cells. The article by Wang et al. entitled *Experimental study on clamping pressure distribution in PEM fuel cells*, Journal of Power Sources, 179 (2008) 305-309 demonstrates that the performance of a fuel cell is better when the clamping force induces within the cells a compressive mechanical stress that is uniformly spatially distributed. For this reason, the article by Yu et al. entitled *Composite endplates with pre-curvature for PEMFC (polymer electrolyte membrane fuel cell)*, Composite Structures 92 (2010) 1498-1503 describes end plates that are initially convex so that, once assembled in the stack, they have a substantially zero curvature, thus leading to a substantially uniform distribution of the clamping force.

Moreover, it is sought to preserve the lifetime of electrochemical cells, for example by increasing the uniformity of the spatial distribution of the current density produced by the cell in operation. Specifically, spatial nonuniformities in current density lead to spatial nonuniformities in the temperature of the cell, which may lead, on the one hand, to an increase in the rate of the degradation reactions of the various components of the cell, and on the other hand, to the generation of mechanical stresses of thermal origin that are liable to decrease the mechanical strength of the components of the cell.

By way of illustration, document FR2976732 describes an electrochemical cell produced so as to obtain uniform local heating within the cell in operation. This heating depends on the electrical current density at each point of the cell, which is itself dependent on the partial pressure of the reactive species. Specifically, considering here the cathodic side of the cell, the amount of oxygen contained in the gas flowing through the distributing circuit gradually decreases as the oxygen is consumed by the cell, thereby leading to a spatial variation in the electrical current density produced by the cell, and therefore to a spatial variation in the heating of the cell. To prevent this spatial nonuniformity in the heating of the cell, the electrical conductivity between the bipolar plate delivering the oxygen and the cell is adjusted locally so as to compensate for the decrease in oxygen partial pressure.

DISCLOSURE OF THE INVENTION

The objective of the invention is to remedy at least some of the drawbacks of the prior art, and more particularly to provide a method for determining the spatial distribution of a parameter representative of an electrical contact resistance of an electrochemical cell especially allowing the uniformity of the local temperature of the electrochemical cell in operation to be increased and thus the lifetime of the latter to be preserved.

To this end, the invention provides a method for determining a spatial distribution of a parameter of interest representative of a contact resistance between a bipolar plate and an adjacent electrode of an electrochemical cell, said cell including two electrodes separated from one another by an electrolyte and placed between bipolar plates suitable for bringing reactive species to the electrodes and for removing the heat produced by the cell in operation, comprising the following steps:

i) providing an electrochemical cell, within which the parameter of interest is distributed with an initial spatial distribution and for which the spatial distribution of a temperature within the electrochemical cell in operation has at least one local value higher than or equal to a preset maximum local value;

ii) defining a spatial distribution of a set-point temperature within the cell in operation, said distribution being such that the local temperature values are lower than preset maximum local values;

iii) measuring a spatial distribution of a first thermal quantity representative of the local removal of heat within said electrochemical cell in operation;

iv) estimating a spatial distribution of a second thermal quantity representative of the local production of heat within said electrochemical cell in operation, depending on said spatial distribution of the set-point temperature and on said spatial distribution of the first thermal quantity, so that the spatial distribution of the temperature of said electrochemical cell in operation, the first thermal quantity of which cell having said measured spatial distribution and the second thermal quantity of which cell having said estimated spatial distribution, is substantially equal to that of the set-point temperature; and v) determining a spatial distribution of the parameter of interest depending on the estimated spatial distribution of the second thermal quantity.

Thus, a spatial distribution of the parameter of interest is obtained and taking into account this spatial distribution in the considered electrochemical cell makes it possible to ensure that the latter has, in operation, a spatial distribution of temperature corresponding substantially to that of the set-point temperature. Thus, in operation, the electrochemical cell then does not present zones in which the temperature is locally above preset maximum local values.

The supply of the electrochemical cell may include a phase of experimental prototyping or numerically modeling an electrochemical cell, a phase of measuring the spatial distribution of the temperature within the electrochemical cell in operation, then a phase of comparing the measured spatial distribution of the temperature to a preset spatial distribution of a maximum temperature. The local values of this spatial distribution of maximum temperature are the what are called preset maximum local values. When at least one local value of the measured temperature is higher than or equal to a corresponding preset maximum local value, i.e. at one and the same position within the spatial distribution, the electrochemical cell is then supplied, i.e. considered, for the following steps of the determining method.

The set-point temperature may be defined so that the local temperature values are below the corresponding maximum local values. The set-point temperature may comprise substantially constant local values, or even a substantially constant local temperature gradient. It may have local values that are not constant within the spatial distribution but that remain below these preset maximum values. It may also comprise a local gradient that is not constant within the spatial distribution but that remains below the preset maximum values.

The measurement of the spatial distribution of the first thermal quantity may be an experimental measurement carried out on a considered electrochemical cell, which will have been manufactured beforehand, or a numerical measurement carried out on a numerical model of the considered electrochemical cell. The first thermal quantity may be the local flow rate of heat-transfer fluid flowing through a cooling circuit of a bipolar plate.

The estimation of the spatial distribution of the second thermal quantity may include:

a phase of generating a mesh, for example a two-dimensional or three-dimensional mesh, of a cooling circuit of at least one bipolar plate of the electrochemical cell, through which circuit a heat-transfer fluid is intended to flow; and a phase of simulating numerically by computer the second thermal quantity on said mesh, by solving a discrete numerical model expressing the second thermal quantity as a function of the local temperature and of the first thermal quantity.

In this case, the numerical model takes into account the spatial distribution of the set-point temperature and the spatial distribution measured beforehand of the first thermal quantity. The discrete numerical model, which is what is called an electrochemical model, may be a relationship expressing a parameter representative of the local production of heat, for example the local heat flux, as a function of local temperature and of a parameter representative of the local removal of heat, for example the local flow rate of the heat-transfer fluid.

Thus, the electrochemical cell, the spatial distribution of the parameter of interest of which was obtained by the determining method, has in operation a spatial distribution of temperature substantially equal to that of the set-point temperature. Thus, the generation of unwanted new hotspots or new temperature nonuniformities that could have appeared if the spatial distribution of the parameter of interest were determined using an essentially thermal approach, i.e. an approach based on a comparison of the actual temperature of hotspots or nonuniformities and the set-point temperature, is avoided.

Preferably, the bipolar plates are formed from two sheets that are bonded to each other, each sheet including embossments forming, in what is called an external face, a circuit for distributing a reactive species, the embossments of the sheets together forming, in what are called internal faces that are opposite the external faces, a cooling circuit including cooling channels that communicate fluidically with one another between an inlet and an outlet of the cooling circuit. The external faces of the sheets are oriented toward an electrochemical-cell electrode. The cooling channels communicate fluidically with one another in the sense that, between the inlet and the outlet of the cooling circuit, they form a two-dimensional fluidic network, i.e. a non-linear network.

Preferably, the step of determining the spatial distribution of the parameter of interest is carried out also depending on a preset value of a parameter representative of the overall electrical power of the electrochemical cell. This parameter may be the overall electrical power, namely the product of the voltage and current density measured across the terminals of the cell, or even the efficiency thereof, for example the voltage of the cell for a given current density. It is then possible both to manage the local temperature within the electrochemical cell, with the aim of optimizing the lifetime thereof, and to maintain a wanted electrical power.

The parameter of interest is preferably the electrical contact resistance of the electrochemical cell, the first thermal quantity is an effective local temperature measured within the cell in operation, and the second thermal quantity is a quantity representative of a local difference between the effective temperature and the set-point temperature.

Preferably, step v) includes:

a sub-step of calculating a spatial distribution of a correctional coefficient from the spatial distribution of the second thermal quantity; and a sub-step in which the spatial distribution of the parameter of interest is determined by correlating the initial spatial distribution of the parameter of interest with the spatial distribution of the correctional coefficient.

Alternatively, step v) may include:
a sub-step of identifying at least one zone of the cell in which the second thermal quantity has an estimated local value above a preset threshold value;
a sub-step of determining the spatial distribution of the parameter of interest by modifying the initial spatial distribution in the identified zone depending on the estimated local value of the second thermal quantity in this zone.

Preferably, the parameter of interest is the electrical contact resistance of the electrochemical cell, the first thermal quantity is representative of the local removal of the heat produced by the cell in operation, and the second thermal quantity is representative of the local production of heat by the cell in operation.

The first thermal quantity may be the measured effective local flow rate of a heat-transfer fluid flowing in a cooling circuit of a bipolar plate of the cell, and the second thermal quantity may be the local heat flux produced by the cell in operation.

Preferably, step v) includes:
a first sub-step of estimating the spatial distribution of the density of an electrical signal produced by the cell in operation, from the estimated spatial distribution of the produced heat flux; and
a second sub-step of determining the spatial distribution of the parameter of interest, from the local density of the electrical signal.

The invention also relates to a method for producing an electrochemical cell, including steps of:
considering a reference electrochemical cell, said cell including two electrodes separated from each other by an electrolyte and placed between bipolar plates suitable for bringing reactive species to the electrodes and for removing the heat produced by the cell in operation, the bipolar plates having an initial thickness spatial distribution, the cell having a parameter of interest representative of the electrical contact resistance, which parameter is spatially distributed with an initial distribution;
determining a spatial distribution of the parameter of interest, using the determining method according to any one of the preceding features; and
producing said cell, from the reference cell in such a way that the parameter of interest has the determined spatial distribution.

By "produced from", what is meant is that the produced electrochemical cell has the same electrochemical properties as those of the reference cell, with the exception of the parameter of interest, which is distributed with the determined spatial distribution. The produced electrochemical cell may be the reference cell in which the initial spatial distribution of the parameter of interest has been modified to be substantially equal to the determined spatial distribution.

Preferably, a spatial distribution of the thickness of at least one of the bipolar plates is determined depending on the determined spatial distribution.

Preferably, said bipolar plate locally has a thickness smaller than or larger than a nominal plate thickness substantially equal to the initial thickness in zones identified beforehand using said determined spatial distribution of the electrical contact resistance.

The invention also relates to a method for producing an electrochemical reactor, including steps of:
considering a reference electrochemical reactor, said reactor including a stack of electrochemical cells clamped and compressed between two end plates, each cell comprising two electrodes separated from each other by an electrolyte and placed between bipolar plates suitable for bringing reactive species to the electrodes and for removing the heat produced by the cell in operation, and having a parameter of interest representative of the electrical contact resistance, which parameter is spatially distributed with an initial distribution;
determining a spatial distribution of the parameter of interest, for at least one of the cells using the determining method according to any one of the preceding features; and
producing said electrochemical reactor, from the reference reactor in such a way that the parameter of interest has the determined spatial distribution.

Preferably, a spatial distribution of the thickness of at least one of the end plates and/or a spatial distribution of the thickness of at least one plate inserted between two adjacent cells of said stack are/is determined depending on the determined spatial distribution.

The invention also relates to an electrochemical cell including two electrodes separated from one another by an electrolyte and placed between bipolar plates suitable for bringing reactive species to the electrodes and for removing the heat produced by the cell in operation, in which at least some of the area of at least one of the bipolar plates has a local thickness smaller than or larger than a nominal plate thickness.

The invention also relates to an electrochemical reactor including a stack of electrochemical cells clamped and compressed between two end plates, each cell comprising two electrodes separated from each other by an electrolyte and placed between bipolar plates suitable for bringing reactive species to the electrodes and for removing the heat produced by the cell in operation, in which at least one of the end plates has a face making contact with the stack of cells and the surface of which is locally structured so that at least some of its area comprises protuberances or indents, and/or in that it includes a plate inserted between two adjacent cells and at least one of the faces of which making contact with the cells has a surface at least some of the area of which is locally structured so as to comprise protuberances or indents.

The invention also relates to a storage medium containing instructions for implementing the determining method according to any one of the preceding features, these instructions being executable by a processor.

BRIEF DESCRIPTION OF THE DRAWINGS

Other aspects, aims, advantages and characteristics of the invention will become more clearly apparent on reading the following detailed description of preferred embodiments thereof, which description is given by way of nonlimiting example and with reference to the appended drawings, in which.

DETAILED DESCRIPTION OF PARTICULAR EMBODIMENTS

In the figures and in the rest of the description, the same references are used to reference identical or similar components. In addition, the various components are not shown to scale so as to make the figures clearer. Moreover, the various embodiments and variants are not mutually exclusive and can be combined with one another. Unless indicated otherwise, the terms "substantially", "about" and "of the order of" mean to within 10%.

The various embodiments and variants will be described with reference to a fuel cell and in particular to a PEM (proton exchange membrane) hydrogen fuel cell the cathode of which is supplied with oxygen and the anode of which with hydrogen. However, the invention is applicable to any type of fuel cell, and in particular to those operating at low temperatures, i.e. temperatures below 250° C., and to electrochemical electrolyzers.

Figure 1A:
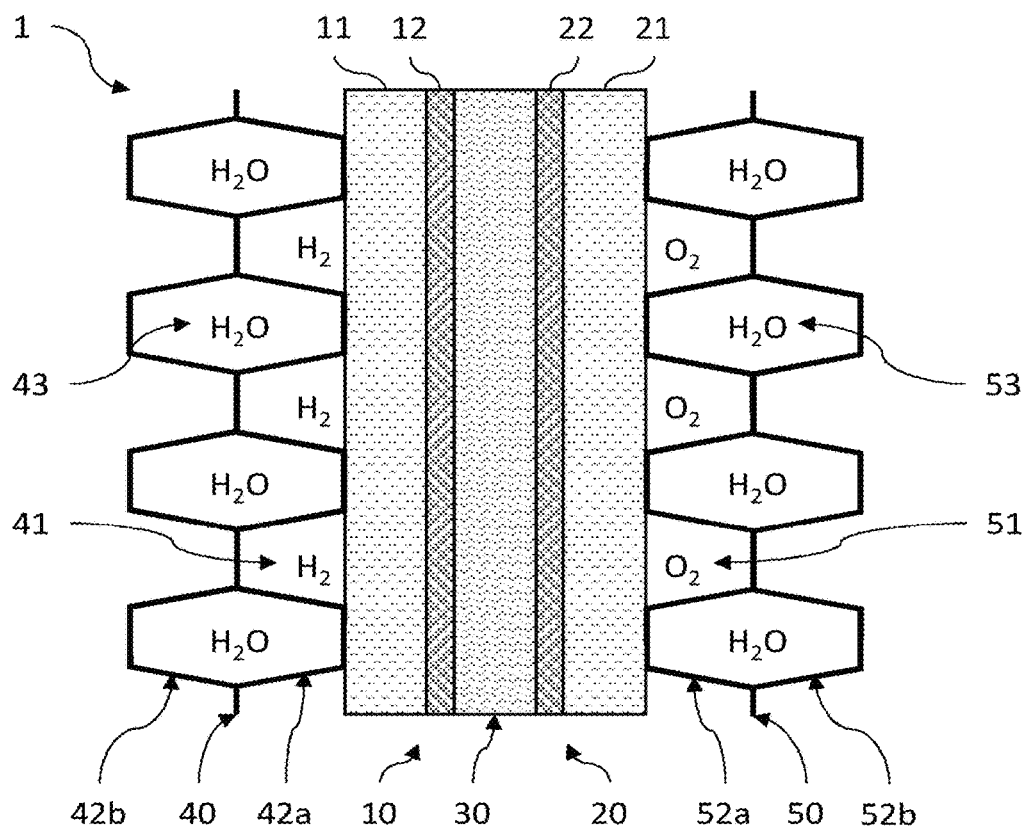
FIG. 1a is a schematic cross-sectional representation of an exemplary electrochemical cell.

FIG. 1a partially and schematically illustrates an exemplary electrochemical cell 1 belonging to a stack of cells of a PEM fuel cell. The cell 1 includes an anode 10 and a cathode 20 that are separated from each other by an electrolyte here comprising a polymer membrane 30, the electrodes 10, 20 being placed between two bipolar plates 40, 50 that are suitable for bringing reactive species to the electrodes and for removing the heat produced during the electrochemical reaction.

The bipolar plates include a circuit 41 for distributing hydrogen, which circuit is located on an anodic side, and a circuit 51 for distributing oxygen, which circuit is located on a cathodic side. They are here formed from two metal sheets 42a, 42b; 52a, 52b, that are joined to one another and pressed so as to form the distributing circuits. The arrangement of the embossments also allows a cooling circuit 43, 53 to be produced inside the plates, through which a heat-transfer fluid may flow without making contact with the electrodes. Other bipolar-plate technologies may be used, for example the plates may be produced from a filled composite, for example a composite filled with graphite, and in which the embossments are produced by molding.

As mentioned above, each electrode 10, 20 includes a gas diffusion layer (GDL) 11, 21 placed in contact with one of the bipolar plates 40, 50 and an active layer 12, 22 located between the membrane 30 and the diffusion layer 11, 21. The diffusion layers 11, 21 are made from a porous material that permits the diffusion of the reactive species from the distributing circuit of the bipolar plates to the active layers, and the diffusion of the products generated by the electrochemical reaction to the same distributing circuit. The active layers 12, 22 are the site of electrochemical reactions. They include materials suitable for allowing the oxidation and reduction reactions at the respective interfaces of the anode and cathode with the membrane to take place. More precisely, they each include an ionomer ensuring the protonic conductivity, for example Nafion, a catalyst for generating the electrochemical reaction, for example platinum, and an electrically conductive carrier, for example a carbon-containing matrix.

The electrochemical cell has an electrical resistance R that especially depends on the sum of the electrical ohmic resistances of the various components of the cell (bipolar plates $R_{PB}$, membrane $R_m$, electrodes $R_{GDL}$) and on the contact resistance Rc between each bipolar plate and the active layer of the adjacent electrode. The contact resistance Rc especially depends on the area of contact between the bipolar plate and the diffusion layer, and on the compressive stress resulting from a clamping force applied to the cell and especially felt by the diffusion layer. The contact resistance thus includes a term related to the interface between the bipolar plate and the diffusion layer and a term related to the specific electrical resistance of the diffusion layer. It may be measured on samples of the constituent materials of the cell, in order to determine its variation as a function of the mechanical load applied at the contact.

Figure 1B:
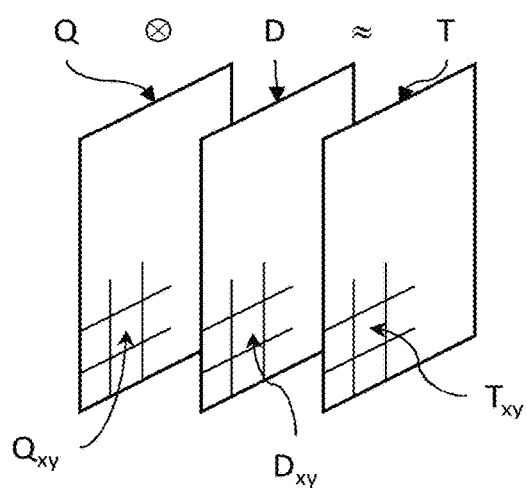
FIG. 1b is a schematic representation illustrating the correlational relationship between the spatial distribution of heat production Q and the spatial distribution of heat removal D the result of which is the spatial distribution of the temperature T of the electrochemical cell in operation.

FIG. 1b schematically shows the spatial distribution of the temperature T of the electrochemical cell as the resultant of a correlational relationship between the spatial distribution of a heat production source term, in other words a quantity representative of the production of heat by the cell, for example the produced heat flux Q, and the spatial distribution of a quantity representative of the removal of the heat produced, for example the mass flow rate D of the heat-transfer fluid in the cooling circuit.

Thus, contrary to the teaching of patent application FR2976732 cited above, it is not enough to increase the uniformity of the distribution of production of heat Q and therefore that of the heating of the cell to make the distribution of the effective temperature T of the cell uniform. Specifically, it is important to take into account both the presence of possible local nonuniformities in the heat-production term Q and the presence of possible local non-uniformities in the heat-removal term D.

The local production of heat, or more precisely the local produced heat flux Q, is directly proportional to the local electrical power production, or more precisely to the local current density I, as expressed by the relationship between their respective spatial distributions:

$$Q_{x,y} = I_{x,y}(\Delta H/2F - U_{x,y}) \qquad (1)$$

where $\Delta H$ is the enthalpy of the electrochemical reaction, F is Faraday's constant, and $U_{x,y}$ is the spatial distribution of the local voltage of the cell, the enthalpy and voltage possibly being considered as to be almost uniform at every point of the cell. Thus, the production of heat is impacted by any nonuniformity due to fluidic parameters (dimensions of the circuits for distributing reactive species, etc.) electrochemical parameters (local properties of the electrodes and of the membrane, etc.) but also electrical parameters (electrical resistances of the various components of the cell, the resistivities of the materials for example and the contact resistances between the components of the cell, etc.), which parameters all influence the current-density distribution.

The removal of heat via the flow of heat-transfer fluid may also exhibit local nonuniformities especially due to minor head losses in the cooling circuit. These head losses are a result of the dimensions of the cooling circuit as produced during the production of the bipolar plates, and may lead to the formation of zones of high flow rate or of low flow rate within the cooling circuit.

In the context of the invention, it is sought to adapt the spatial distribution of a parameter of interest representative of the electrical contact resistance of an electrochemical cell, and in particular of the contact resistance Rc between the bipolar plate and an adjacent electrode. The parameter of interest is therefore also representative of the production of electrical power and therefore of heat energy. It is in particular sought to determine the spatial distribution of the parameter of interest so that the spatial distribution of the effective temperature of the cell in operation corresponds to that of a set-point temperature, by taking into account the spatial distribution of the effective heat removal observed for the electrochemical cell.

By parameter representative of the production of electrical power, what is meant is a parameter the value of which influences locally the current density $I_{x,y}$. It is here in particular a question of the electrical contact resistance Rc of the cell between the bipolar plate and the adjacent electrode (especially its diffusion layer) or an equivalent parameter such as contact conductance. Specifically, the lower the contact resistance Rc, the better the current density produced by the cell in operation will be, and vice versa. The value of the contact resistance especially depends on the clamping force exerted on the cell, i.e. on the two bipolar plates one in the direction of the other: the higher the clamping force, the lower the contact resistance will be, this resulting in a higher current density.

By the temperature of the cell, what is meant is local temperature, i.e. the spatial distribution of the temperature of any one of the components of the cell, for example one of the bipolar plates or even one of the electrodes. The temperature of the cell may thus correspond to the spatial distribution of the temperature in the cooling circuit. The effective temperature of the cell is the spatial distribution of the temperature of the cell in operation, at the polarization point defined by the voltage of the cell $U_{tot}$ and the current $I_{tot}$, i.e. the local current density $I_{x,y}$ integrated over the entire area of the cell.

By parameter representative of heat removal, what is meant is a parameter the value of which represents the capacity of the cell to remove locally the produced heat. It may in particular be a question of the local, mass or volume flow rate of the heat-transfer fluid flowing in the cooling circuit.

Lastly, by spatial distribution of a parameter, what is meant is the local value of this parameter at every point in the cell, or more precisely, at every point (x,y) in a plane parallel to the cell in the what is called active zone corresponding to the areal extent of the active layers of the electrodes.

Thus, the electrochemical cell the parameter representative of the contact resistance of which is spatially distributed with the distribution thus determined has an effective temperature, or temperature during operation of the cell, substantially equal to the set-point temperature. This set-point temperature advantageously has a spatial distribution that is substantially uniform scalarwise or gradientwise. By uniform scalarwise, what is meant is that the local value of the temperature is substantially constant. By uniform gradientwise, what is meant is that the local temperature gradient is substantially constant. The local temperature values may however not be constant while remaining below preset maximum local values. The cell then does not contain zones of excess temperature, or hotspots, that on the one hand may increase the rate of the degradation reactions of the components of the cell, and on the other hand may generate mechanical stresses liable to degrade the mechanical strength of the components of the cell. The lifetime of the electrochemical cell is then preserved. By hotspot, what is for example meant is a zone of the cell that contains a temperature peak or a temperature-gradient peak. More precisely, a hotspot may be a zone where the difference between the local temperature and the inlet temperature of the cooling circuit is larger than the product of a coefficient and the temperature difference between the inlet and outlet of the cooling circuit, the coefficient possibly being about 1.1 to 3 or more, and preferably being about 1.5. By way of example, for a temperature of 77° C. at the inlet of the cooling circuit and of 80° C. at the outlet of the circuit, and for a coefficient equal to 1.5, a hotspot is a zone of the cell in which the local temperature exceeds 81.5° C.

Figure 2:
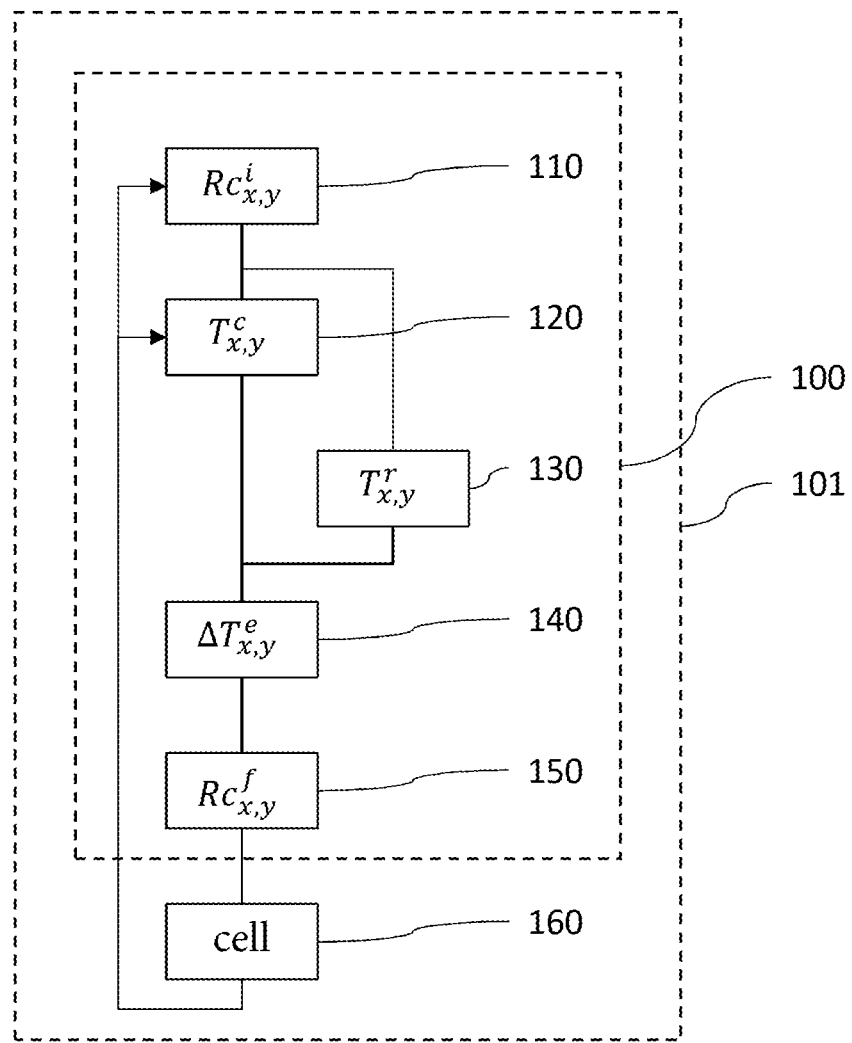
FIG. 2 is a flowchart of a method for determining the spatial distribution of the electrical contact resistance of the electrochemical cell according to a first embodiment.

FIG. 2 is a flowchart of a method for determining the spatial distribution of the parameter of interest representative of the electrical contact resistance of the electrochemical cell according to a first embodiment. In this example, the parameter of interest is the electrical contact resistance Rc of the electrochemical cell between the bipolar plate and the adjacent electrode (and especially the diffusion layer thereof) the value $Rc_{x,y}$ of which has a direct influence on the local electrical current density $I_{x,y}$ produced locally during the electrochemical reaction and therefore on the local produced heat flux $Q_{x,y}$.

Generally, according to this first embodiment 100, an optimized spatial distribution $Rc_{x,y}^f$ of the contact resistance Rc is determined from an estimation of the spatial distribution $\Delta T_{x,y}^e$ of a difference $\Delta T^e$ between an effective temperature $T^r$ of the cell in operation, in which cell the contact resistance Rc is spatially distributed with a given initial distribution, and a preset set-point temperature $T^c$. It is then possible to produce a cell the contact resistance Rc of which has the optimized distribution $Rc_{x,y}^f$, so that the effective temperature $T^r$ of the modified cell is substantially equal to the set-point temperature $T^c$.

In a first step 110, a reference electrochemical cell is defined within which the contact resistance Rc is spatially distributed with an initial distribution $Rc_{x,y}^i$. The cell has a structure identical or similar to that described with reference to FIG. 1. The initial spatial distribution $Rc_{x,y}^i$ of the electrical resistance may be substantially uniform, i.e. here it has a value that is substantially constant at every point in the active zone. By way of example, the areas of contact between the bipolar plate and the diffusion layer are considered to be uniformly distributed, and the clamping force applied to the cell is considered to be substantially uniform.

In a step 120, a spatial distribution $T_{x,y}^c$ of a set-point temperature $T^c$ of the reference cell when the latter is in operation and producing a total current density $I_{tot}$ for a given voltage $U_{tot}$ is defined. To the first order, the set-point temperature $T^c$ of the cell may correspond to a temperature of the heat-transfer fluid in the cooling circuit, the distribution of this temperature then especially depending on its values at the inlet $T_e^c$ and at the outlet $T_s^c$ of the cooling circuit. By way of illustration, the inlet temperature may be set beforehand, for example to 75° C., and the outlet temperature may be estimated from the thermal power $P_{th}$ to be removed, the latter corresponding to the electrical power $P_e = I_{tot} \cdot U_{tot}$ delivered during operation of the cell. The thermal power $P_{th}$ is estimated by integrating over the active zone the local produced heat flux $Q_{x,y}$ obtained from relationship (1). The outlet temperature $T_s^c$ is then estimated by correlating the thermal power $P_{th}$ estimated beforehand with the average total flow rate $<D_{tot}>$ of the heat-transfer fluid in the cooling circuit, by means of the heat capacity $c_p$ of the heat-transfer fluid. It is then possible to define the spatial distribution $T_{x,y}^c$ of the set-point temperature $T^c$ from the values of the temperature of the heat-transfer fluid at the inlet $T_e^c$ and outlet $T_s^c$ of the cooling circuit, the distribution $T_{x,y}^c$ advantageously being uniform gradientwise, i.e. the local set-point temperature gradient is substantially constant.

In a step 130, a spatial distribution $T_{x,y}^r$ of a first thermal quantity representative of the temperature of the cell in operation is obtained. The first thermal quantity is here the effective temperature $T^r$ of the electrochemical cell when it is operating under the same operating conditions as those considered in step 120. This distribution $T_{x,y}^r$ is not estimated but is the result of a measurement by experimental or numerical means. It may thus be obtained by experimental measurement of an electrochemical cell having the same properties as the reference cell defined in step 110, for example by means of an S++ board sold by "S++ Simulation Services", including an invasive plate inserted between two bipolar plates and suitable for measuring a spatial distribution of temperature. The distribution $T_{x,y}^r$ of effective temperature may also be obtained by numerical simulation from an electrochemical cell model, for example that described in the publication by Inoue et al., *Numerical analysis of relative humidity distribution in polymer electrolyte fuel cell stack including cooling water*, J. Power Sources 162 (2006) 81-93.

The distribution $T_{x,y}^r$ of the effective temperature $T^r$ obtained by experimental or numerical measurement thus takes into account local nonuniformities in the produced heat flux, which depends on local current density, and local nonuniformities in heat removal, which especially depends on the local flow rate of the heat-transfer fluid in the cooling circuit.

In a step 140, the spatial distribution of a second thermal quantity is estimated, here a quantity $\Delta T^e$ representative of a local difference between the effective temperature $T^r$ and the set-point temperature $T^c$. This quantity of local difference $\Delta T^e$ is estimated from the spatial distribution $T_{x,y}^c$ of the set-point temperature $T^c$ defined in step 120 and from the spatial distribution $T_{x,y}^r$ of the effective temperature $T^r$ measured in step 130. It may be a question of the difference between the local value of the effective temperature and that of the set-point temperature, or of a ratio of these values, inter alfa. Here, the term-to-term difference between the distributions of the effective temperature and set-point temperature are considered: $\Delta T_{x,y}^e = T_{x,y}^r - T_{x,y}^c$.

Next, in a step 150, the spatial distribution $Rc_{x,y}^f$ of the contact resistance Rc is determined depending on the spatial distribution $\Delta T_{x,y}^e$ of the local difference $\Delta T^e$.

Figure 3:
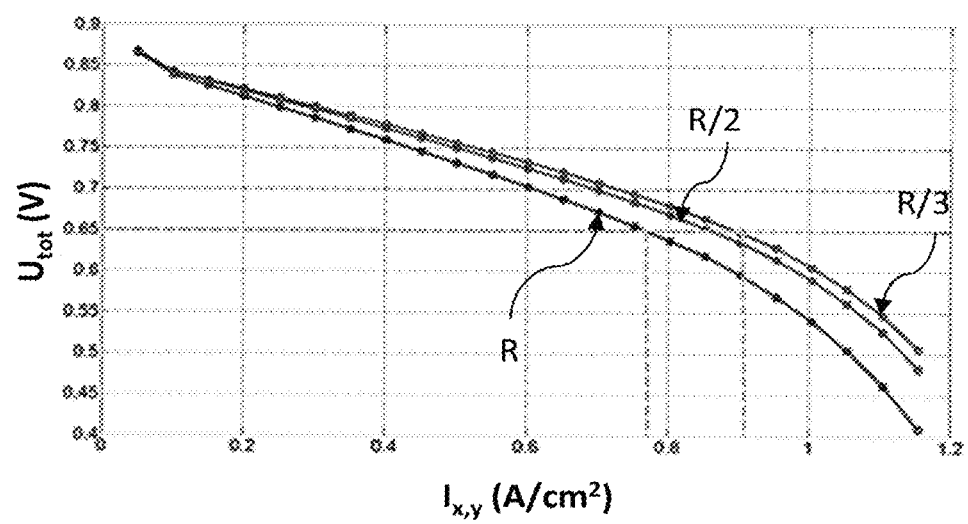
FIG. 3 illustrates exemplary polarization curves that show the variation in the electrical voltage of the cell as a function of the local electrical current density, for various values of local electrical resistance.

According to a first variant, a correctional coefficient or weighting factor is firstly calculated, the spatial distribution of which may be proportional term-to-term to that $\Delta T_{x,y}^e$ of the local difference $\Delta T^e$. By way of example, the correctional coefficient varies continuously between a minimum value, for example lower than or equal to unity, and a maximum value, as the local difference $\Delta T^e$ varies between a substantially zero value and a maximum value, respectively. With reference to FIG. 3, the maximum value of the correctional coefficient may be determined from polarization curves of the reference cell for various local values of the electrical resistance of the cell. In this example of polarization curves obtained using an experimentally validated electrochemical-cell model, the local current density decreases from 0.93 A/m² to 0.77 A/m² when the electrical resistance of the cell is multiplied by 3, for a cell voltage equal to 0.65 V. This decrease of 17% in the local current density leads to a substantially identical decrease in the local production of heat. Next, the spatial distribution $Rc_{x,y}^f$ of the electrical resistance Rc is determined by correlating, for example by multiplying term-to-term, the initial spatial distribution $Rc_{x,y}^i$ of the electrical resistance Rc with the spatial distribution of the correctional coefficient.

According to a second variant, firstly at least one zone $Z_i$ of the cell in which the difference $\Delta T^e$ has a value above a preset threshold value is identified, the threshold value for example being representative of a hotspot. Next, the spatial distribution $Rc_{x,y}^f$ of the electrical resistance Rc is determined by modifying the initial spatial distribution $Rc_{x,y}^i$ in the identified zone $Z_i$ depending on the local value of the difference $\Delta T^e$ in this zone. By way of example, the initial spatial distribution $Rc_{x,y}^i$ may be modified locally using a correctional coefficient the value of which is proportional to that of the difference $\Delta T^e$ in this zone. As in the first variant, the correctional coefficient varies continuously between a minimum value and a maximum value that are determined beforehand from polarization curves, which are similar or identical to those in FIG. 3, by means of an intermediate step of subtracting the ohmic resistances of the components of the cell in order to deduce from the total electrical resistance the value of the contact resistance Rc.

Thus, a spatial distribution $Rc_{x,y}^f$ of the contact resistance Rc of the electrochemical cell is obtained. It is then possible to modify the initial distribution $Rc_{x,y}^i$ of the contact resistance Rc of the reference cell so that it is the same as the new distribution determined in step 150. The cell thus optimized then has, in operation, an effective temperature the spatial distribution of which is substantially equal to that of the set-point temperature. Insofar as the distribution of the set-point temperature is advantageously uniform, the cell in operation has an effective temperature the distribution of which is also substantially uniform, thus allowing the lifetime of the cell to be preserved.

Figure 4:
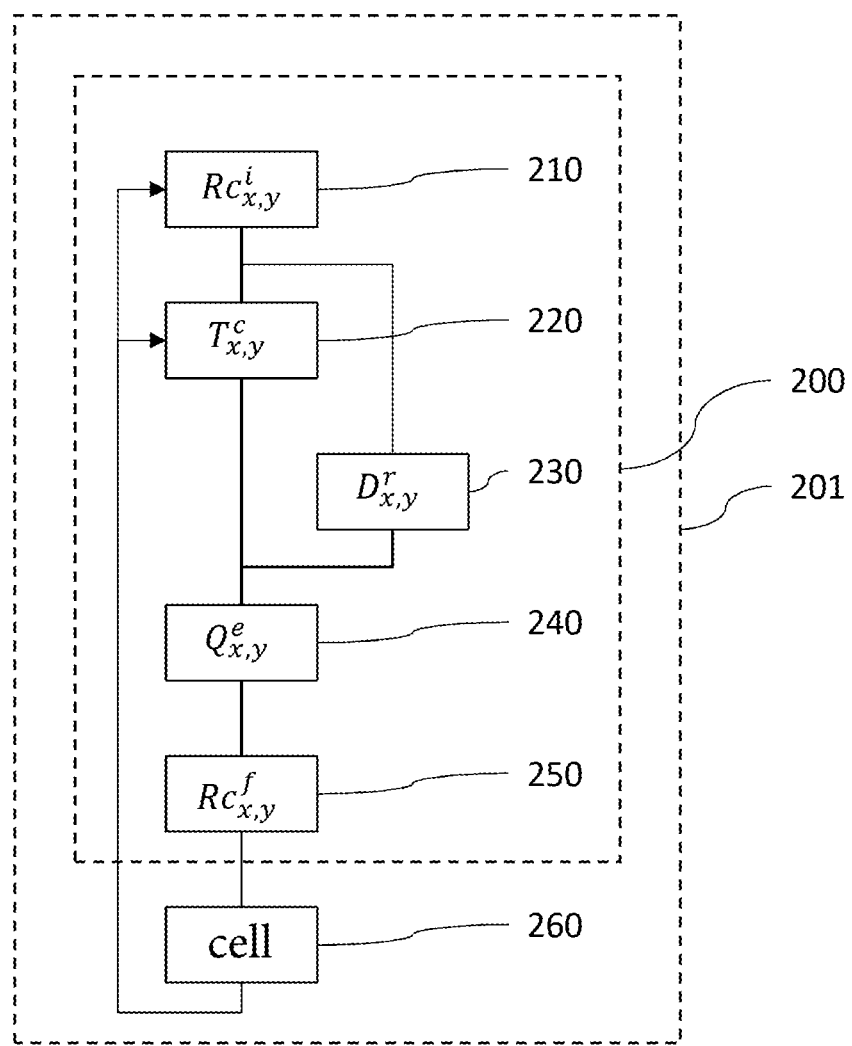
FIG. 4 is a flowchart of a method for determining the spatial distribution of the electrical contact resistance of the electrochemical cell according to a second embodiment.

FIG. 4 is a flowchart of a method for determining the spatial distribution of a parameter of interest representative of the electrical contact resistance of the electrochemical cell, according to a second embodiment 200. In this example, the parameter of interest is the electrical contact resistance of the electrochemical cell between the bipolar plate and the adjacent electrode (and especially the diffusion layer thereof) the value of which has a direct influence on the electrical current density produced locally during the electrochemical reaction.

Generally, according to this second embodiment, the spatial distribution $Rc_{x,y}^f$ of the contact resistance Rc is determined from the estimation of the spatial distribution of the production of heat necessary to obtain the spatial distribution of a set-point temperature, while taking into account the spatial distribution of a thermal quantity representative of the effective heat removal in the cell. It is then possible to produce a cell having a contact resistance Rc having the determined spatial distribution, so that the effective temperature is then substantially equal to the set-point temperature. The electrochemical cell, the parameter of interest of which is spatially distributed with the optimized distribution, has in operation a temperature substantially equal to the set-point temperature. Unwanted new hotspots or new temperature nonuniformities are not formed.

This approach, which is what may be referred to as an electrochemical and no longer essentially thermal approach, is particularly advantageous when at least one bipolar plate, or even both bipolar plates, of the electrochemical cell are formed from sheets that are bonded to one another and that contain embossments that define a two-dimensional cooling circuit. The embossments of each sheet, in the faces referred to as the external faces of the sheets, i.e. the faces oriented toward an electrode, define a circuit for distributing reactive species. In the internal faces, i.e. the faces opposite the external faces, the embossments form a cooling circuit through which a heat-transfer fluid is intended to flow. The cooling circuit is what is called linear when the cooling channels do not communicate with one another, i.e. when the heat-transfer fluid, between the inlet and outlet of the cooling circuit, cannot substantially pass from one cooling channel to another. The cooling circuit is what is called two-dimensional when the cooling channels communicate with one another, so as to form a two-dimensional fluidic network that is non-linear. This is especially the case when the distributing channels of a sheet are not parallel to those of the other sheet.

In a first step 210, a reference electrochemical cell is defined or supplied, within which cell the contact resistance Rc between a bipolar plate and the adjacent cell of the cell is spatially distributed with an initial distribution $Rc_{x,y}{}^i$. The initial spatial distribution $Rc_{x,y}{}^i$ of the contact resistance Rc may be substantially uniform scalarwise, so that its local value is substantially constant at every point in the active zone. The cell has a structure that is identical or similar to that described with reference to FIG. 1 and this step is similar or identical to the step 110 described above. The considered electrochemical cell then has, in operation, a spatial distribution of temperature at least one local value of which is higher than or equal to a preset maximum local value. The latter may be constant or differ depending on the considered point of the electrochemical cell. This step may include:

a phase of experimental prototyping or numerically modeling an electrochemical cell;

a phase of measuring the spatial distribution of the temperature within the electrochemical cell in operation; then a phase of comparing the measured spatial distribution of the temperature to a preset spatial distribution of a maximum temperature. The local values of this spatial distribution of maximum temperature are the what are called preset maximum local values.

When at least one local value of the measured temperature is higher than or equal to a corresponding preset maximum local value, i.e. at one and the same position within the spatial distribution, the electrochemical cell is then supplied, i.e. considered, for the following steps of the determining method.

In a step 220, a spatial distribution $T_{x,y}{}^c$ of a set-point temperature $T^c$ of the reference cell when the latter is in operation and producing a total current density $I_{tot}$ for a given voltage $U_{tot}$ is defined. This step is similar or identical to the step 120 described above. The local values of the spatial distribution of the set-point temperature are lower than corresponding maximum local values.

Optionally, it is advantageous to specify the spatial distribution $T_{x,y}{}^c$ of the set-point temperature $T^c$ as a function of the spatial distribution of the concentration of reactive species in the active zone between the inlet and outlet of the corresponding distributing circuit. Specifically, the consumption of reactive species within the active zone of the cell leads to a gradual decrease in the concentration of reactive species along the distributing circuit. This gradual decrease results in a decrease in the local current density produced by the cell and therefore in the local production of heat, thereby possibly leading to the formation of nonuniformities in the temperature of the cell. To compensate for this gradual decrease in the production of heat, it is advantageous to define a set-point temperature that takes into account the decrease in the concentration of reactive species, so that the effective temperature of the cell in operation corresponds to the set-point temperature, the latter advantageously having a uniform spatial distribution. To do this, the spatial distribution $\tilde{T}_{x,y}{}^c$ of the specified set-point temperature $\tilde{T}^c$ may for example be written:

$$\tilde{T}_{x,y}{}^c = T_{x,y}{}^c + K^i \cdot [\max(c_{x,y}{}^i) - c_{x,y}{}^i] \tag{2}$$

where $c_{x,y}{}^i$ is the spatial distribution of the concentration $c^i$ in reactive species i, for example in oxygen, and $K^i$ is a positive constant, for example close to 1, which may be subsequently adjusted. The spatial distribution $c_{x,y}{}^i$ of the concentration $c^i$ may be estimated to the first order from the routing of the channels of the distributing circuit of the reactive species in question and by assuming a uniform consumption of the reactive species i throughout the active zone. It may also be more accurately determined by numerical or experimental measurement of the spatial distribution of the current density in a cell that is similar or identical to the reference cell, which allows the spatial distribution of the concentration of the reactive species to be deduced. Other relationships (2) may be used to specify the spatial distribution of the set-point temperature while taking into account the spatial variation in the concentration of reactive species. Thus, a spatial distribution $\tilde{T}_{x,y}{}^c$ of the set-point temperature $\tilde{T}^c$ is obtained that thus allows a distribution of the effective temperature of the cell to be obtained the uniformity of which is improved.

Moreover, optionally and possibly complementarily with the step of specifying the set-point temperature described above, it is advantageous to specify the spatial distribution $T_{x,y}{}^c$ of the set-point temperature $T^c$ as a function of the spatial distribution $\phi_{x,y}$ of the relative humidity $\phi$ in the distributing circuits. The relative humidity $\phi$ is defined conventionally as the ratio of the partial pressure $P_{H2O}$ of the water vapor contained locally in the gas flowing through the distributing circuit to the saturated vapor pressure $P_{sat}$. The relative humidity $\phi$ has an effect on the rate of the electrochemical reactions. Thus, to compensate for the local variation in relative humidity, it is advantageous to define a set-point temperature that compensates for this local variation, for example for local humidification or dehumidification in the distributing circuits, so that the effective temperature of the cell in operation has a uniform spatial distribution. To do this, the spatial distribution $\tilde{T}'_{x,y}{}^c$ of the specified set-point temperature $\tilde{T}'^c$ may for example be written:

$$\tilde{T}'_{x,y}{}^c = T_{x,y}{}^c + K^\varphi \cdot [\varphi_{x,y}/\varphi_{in}] \tag{3}$$

where $\varphi_{x,y}$ is the spatial distribution of the relative humidity $\varphi$ in the distributing circuit, $\varphi_{in}$ is the relative humidity at the inlet of the distributing circuit, and $K^\varphi$ is a positive constant, for example close to 1, which may be subsequently adjusted.

The distribution $\varphi_{x,y}$ of the relative humidity $\varphi$ may be estimated to the first order from the routing of the channels of the distributing circuit in question and by assuming a uniform current density throughout the active zone. It may also be more accurately determined by numerical or experimental measurement of the spatial distribution of the current density in a cell that is similar or identical to the reference cell, which allows the spatial distribution of the relative humidity to be deduced. Other relationships (3) may be used to specify the spatial distribution of the set-point temperature from the spatial variation in relative humidity. Thus, a spatial distribution $\hat{T}_{x,y}{}^c$ of the set-point temperature $\hat{T}^c$ is obtained that thus allows a distribution of the effective temperature of the cell to be obtained the uniformity of which is improved.

In a step 230, a spatial distribution $D_{x,y}{}^r$ of a first thermal quantity representative of the removal of heat $D^r$ within the cell in operation is obtained. The first thermal quantity is here the mass flow rate $D^r$ of heat-transfer fluid in the cooling circuit. This distribution $D_{x,y}{}^r$ is not estimated but is the result of a measurement by experimental or numerical means. It may thus be obtained by experimental measurement of an electrochemical cell having the same properties as the reference cell defined in step 210, for example by means of a particle image velocimetry (PIV) technique or any other suitable technique, carried out on a cooling circuit having the same dimensional characteristics as that of the reference cell. The distribution $D_{x,y}{}^r$ of the mass flow rate $D^r$ may also be obtained by numerical simulation using a flow simulation software package such as FLUENT or COMSOL for example.

In a step 240, the spatial distribution $Q_{x,y}{}^e$ of a second thermal quantity $Q^e$ is estimated from said spatial distribution $T_{x,y}{}^c$ of the set-point temperature $T^c$ defined in step 220 and from said spatial distribution $D_{x,y}{}^r$ of the heat-transfer fluid flow rate $D^r$ obtained in step 230. The second thermal quantity is representative of the local production of heat and here corresponds to the local heat flux $Q^e$ that the heat-transfer fluid removes $D^r$ to obtain the set-point temperature $T^c$.

Figure 5:
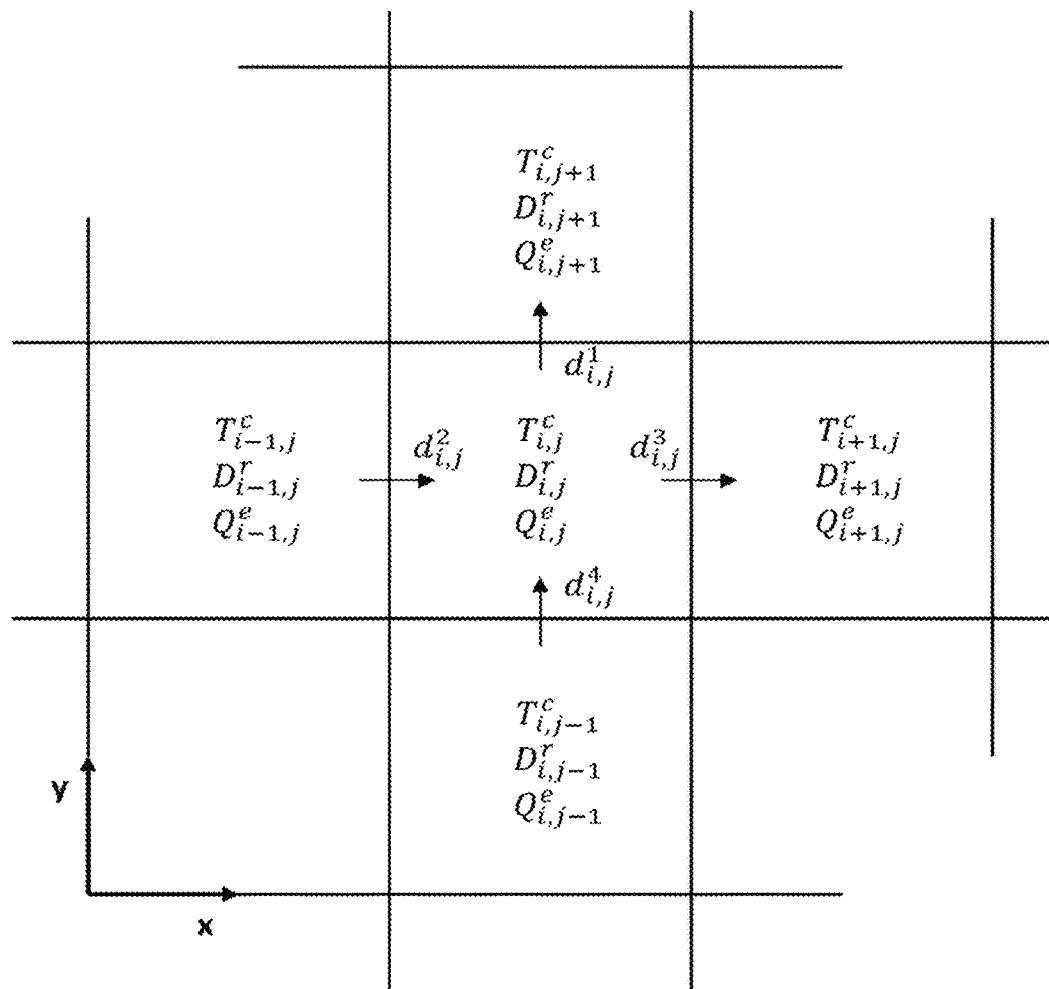
FIG. 5 is an example of a mesh of the cooling circuit, in which each mesh cell includes a local heat production term $Q_{i,j}^e$, a local heat removal term $D_{i,j}^r$, and a local temperature term $T_{i,j}^c$.

To do this, as illustrated in FIG. 5, a model of the cooling circuit is discretized into a two-dimensional or three-dimensional, here two-dimensional, mesh each mesh cell of which is an elementary volume (i,j) passed through by the heat-transfer fluid. Thus, each mesh cell (i,j) of the distributing circuit is associated with two known quantities: the local set-point temperature $T_{i,j}{}^c$ and the local flow rate $D_{i,j}{}^r$ of the heat-transfer fluid; and with a quantity to be determined: the local produced heat flux $Q_{i,j}{}^e$. Next, the amount of heat and fluid transferred between the mesh cell in question and the adjacent mesh cells is calculated by determining, on the one hand, the temperature differences and, on the other hand, the flow rates of the heat-transfer fluid at the four facets of the mesh cell in question. This calculation may be carried out by numerical simulation by computer, on said mesh. This amounts to solving a discrete numerical model expressing the second thermal quantity, namely here the local heat flux, as a function of the local temperature and of the first thermal quantity, namely here the local flow rate of the heat-transfer fluid. The numerical model, which is what is referred to as an electrochemical model, may be expressed by relationship (6).

The temperature differences at the four facets of the mesh cell (i,j) may be calculated in the following way:

$$\delta T_{i,j}{}^1 = T_{i,j}{}^c - T_{i,j+1}{}^c \tag{4-1}$$

$$\delta T_{i,j}{}^2 = T_{i,j}{}^c - T_{i-1,j}{}^c \tag{4-2}$$

$$\delta T_{i,j}{}^3 = T_{i,j}{}^c - T_{i+1,j}{}^c \tag{4-3}$$

$$\delta T_{i,j}{}^4 = T_{i,j}{}^c - T_{i,j-1}{}^c \tag{4-4}$$

The flow rates of the heat-transfer fluid at the four facets of the mesh cell (i,j) may be obtained by projecting the mass flow rate $D_{i,j}{}^r$ (here a vectorial datum) onto the vectors $e_x$ and $e_y$ passing through the mesh cells (i−1,j), (i,j) and (i+1,j), and through the mesh cells (i,j−1), (i,j) and (i,j+1), respectively:

$$d_{i,j}{}^1 = (D_{i,j}{}^r \cdot e_y + D_{i,j+1}{}^r \cdot e_y)/2 \tag{5-1}$$

$$d_{i,j}{}^2 = (D_{i,j}{}^r \cdot e_x + D_{i-1,j}{}^r \cdot e_x)/2 \tag{5-2}$$

$$d_{i,j}{}^3 = (D_{i,j}{}^r \cdot e_x + D_{i+1,j}{}^r \cdot e_x)/2 \tag{5-3}$$

$$d_{i,j}{}^4 = (D_{i,j}{}^r \cdot e_y + D_{i,j-1}{}^r \cdot e_y)/2 \tag{5-4}$$

By convention, the local flow rate $d_{i,j}$ is considered to be positive when the fluid enters into the mesh cell (i,j) and negative when the fluid exits therefrom.

Lastly, the spatial distribution $Q_{x,y}{}^e$ of the heat flux $Q^e$ produced by the cell is calculated from the relationship:

$$Q_{x,y}{}^e \approx Q_{i,j}{}^e = \Sigma_{k=1}^{4} d_{i,j}{}^k \cdot c_p \cdot \delta T_{i,j}{}^k \tag{6}$$

Thus, the spatial distribution of the heat flux $Q^e$ that the cell must produce for the effective temperature distribution to correspond to that of the set-point temperature is obtained, the distribution of the effective mass flow rate of the heat-transfer fluid in the distributing circuit being known.

In a step 250, the spatial distribution $Rc_{x,y}{}^f$ of the contact resistance $Rc$ is determined depending on the spatial distribution $Q_{x,y}{}^e$ of the produced heat flux $Q^e$. To do this, it is possible to firstly estimate the spatial distribution of the density of an electrical signal produced by the cell in operation, for example the current density $I^e$, from the estimated spatial distribution $Q_{x,y}{}^e$ of the produced heat flux $Q^e$. Insofar as the produced heat flux $Q^e$ is approximately proportional to the current density $I^e$, the latter may be determined from the relationship:

$$I^e_{x,y} = Q^e_{x,y} \cdot \frac{I_{tot}}{Q_{tot}} \tag{7}$$

where $I_{tot}$ is the total current density delivered by the electrochemical cell in operation, and $Q_{tot}$ is the total produced heat flux, which is obtained by integrating the spatial distribution $Q_{x,y}{}^e$ over all the active area.

Next, the new spatial distribution $Rc_{x,y}{}^f$ of the contact resistance $Rc$ is determined from the local density of the electrical current $I_{x,y}{}^e$. To do this, one approach consists in determining the minimum $Rc_{min}$ and maximum $Rc_{max}$ values of the contact resistance. It may be a question of an experimental measurement of a sample cell having the same properties as those of the reference cell, or of a measurement by numerical simulation, for example with the ANSYS software package (cf. Z. Wu, Y. Zhou, G. Lin, S. Wang, S. J. Hu, *An improved model for predicting electrical contact resistance between bipolar plate and gas diffusion layer in proton exchange membrane fuel cells*, J. Power Sources, Volume 182, Issue 1, 15 Jul. 2008, 265-269). Next, the spatial distribution $Rc_{x,y}{}^f$ is calculated, for example using the relationship:

$$Rc^f_{x,y} = \min\left(Rc_{max}, Rc_{min} \frac{I^e_{max}}{I^e_{x,y}}\right) \tag{8}$$

where $I_{max}^e$ is the maximum value of the local current density $I_{max}^e$. The local contact resistance thus varies linearly between the minimum $Rc_{min}$ and maximum $Rc_{max}$ values as a function of the local value of the current density $I^e$. Of course, any other law, for example a polynomial, exponential or logarithmic law, causing the local contact resistance to vary so that the minimum value $Rc_{min}$ corresponds to a maximum local current density and vice versa, may be used. The minimum $Rc_{min}$ and maximum $Rc_{max}$ values may be preset depending on the overall electrical power $U_{tot} \cdot I_{tot}$ wanted for the electrochemical cell, where $U_{tot}$ is the electrical voltage and $I_{tot}$ the electrical current density measured across the terminals of the cell, or an equivalent parameter such as the efficiency of the cell (the voltage for a given current density).

Thus, a spatial distribution $Rc_{x,y}^f$ of the electrical contact resistance Rc taking into account the distribution of production of electrical power $I^e$ and therefore of thermal energy $Q^e$, and which ensures the effective temperature of the cell in operation corresponds to the set-point temperature $T^c$, has been determined, while also taking into account the effective removal $D^r$ of heat by the cooling circuit. Insofar as the set-point temperature is advantageously spatially uniform, a cell the electrical resistance Rc of which is distributed with the spatial distribution $Rc_{x,y}^f$ thus determined has, when it is operating at the polarization point $U_{tot}$ and $I_{tot}$, an effective temperature the spatial distribution of which is uniform.

A method for producing an electrochemical cell will now be described. A reference electrochemical cell that is identical or similar to the reference cell defined in steps 110 and 210 is considered.

The reference cell has, between the bipolar plate and the diffusion layer of the adjacent electrode, an electrical contact resistance Rc that is spatially distributed with an initial distribution $Rc_{x,y}^i$. Using the method described above with reference to FIG. 2 or 4, a spatial distribution $Rc_{x,y}^f$ of the contact resistance Rc of the electrochemical cell is determined. Next, in a step 160 (FIG. 2) or 260 (FIG. 4), the cell is produced in such a way that the electrical contact resistance Rc has the determined spatial distribution $Rc_{x,y}^f$.

To do this, the method for producing an electrochemical cell includes a step in which the mechanical stress applied to the reference cell, and in particular applied to the diffusion layer compressed between the bipolar plate and the active layer, is modified locally so as to obtain the determined local value $Rc_{x,y}^f$ of the contact resistance Rc.

According to a first variant, described with reference to FIGS. 6a and 6b, the thickness of the bipolar plate is adjusted locally so as to modify the compressive mechanical stress applied to the diffusion layer and therefore the contact resistance Rc. This adjustment is preferably made without modifying the clamping load applied to the cell by means of the end plates between which the electrochemical cell is placed.

Figure 6A:
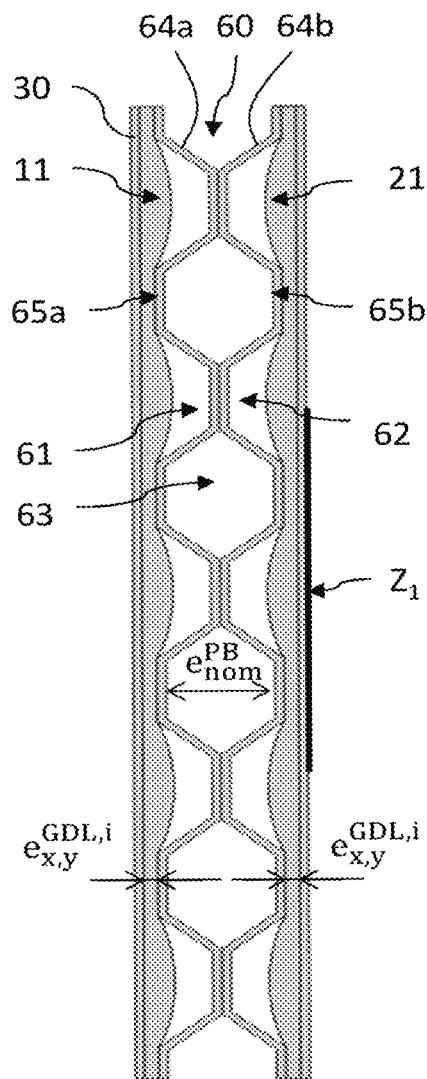
FIGS. 6a and 6b schematically and partially illustrate a bipolar plate located between two adjacent electrochemical cells, the bipolar plate having a thickness that is either substantially constant spatially (FIG. 6a) or that varies locally (FIG. 6b)

FIG. 6a illustrates one portion of an example of reference cells in which the contact resistance Rc has a substantially uniform initial distribution $Rc_{x,y}^i$. A bipolar plate 60 making contact, on the one hand, with an anodic diffusion layer 11 covered by an active layer and an electrolytic membrane 30 of a first reference cell, and, on the other hand, with a cathodic diffusion layer 21 covered by an active layer and an electrolytic membrane of a second reference cell is shown in this figure. The bipolar plate 60 is here formed by joining two electrically conductive and for example metal sheets 64a, 64b comprising embossments 65a, 65b forming a hydrogen-distributing circuit 61 making contact with the anodic diffusion layer 11 and an oxygen-distributing circuit 62 making contact with the cathodic diffusion layer 21. A cooling circuit 63 through which a heat-transfer fluid is able to flow is also present. It is the embossments 65a, 65b forming the cooling ducts 63 of the bipolar plate 60 that make contact with the diffusion layers 11, 21.

The electrical contact resistance between the bipolar plate 60 and each diffusion layer 11, 21 is, by definition, formed in the zones of mechanical contact between these components. Insofar as the bipolar plate 60 has a spatially constant nominal thickness $e_{nom}^{PB}$ here corresponding to the dimension of the cooling ducts 63 along an axis substantially orthogonal to the mean plane of the bipolar plate, and insofar as a spatially uniform clamping force has been applied to the cells, the diffusion layers 11 and 21 are locally compressed between the active layers and the bipolar plate uniformly. By thickness of the bipolar plate, what is meant is the dimension of the plate substantially orthogonal to the mean plane of the plate in the zones of contact with the diffusion layers. The diffusion layers therefore have locally a uniform thickness $e_{x,y}^{GDL,i}$ in the zones of mechanical contact with the bipolar plate, and are subjected to a compressive mechanical stress $\sigma_{x,y}^i$ that is also uniform. The initial distribution $Rc_{x,y}^i$ of the contact resistance Rc is therefore substantially uniform. It is assumed here that the reference cells comprise a zone $Z_1$, or hotspot, the temperature of which is too high, i.e. the local value of the effective temperature is higher than a preset threshold value.

Figure 6B:
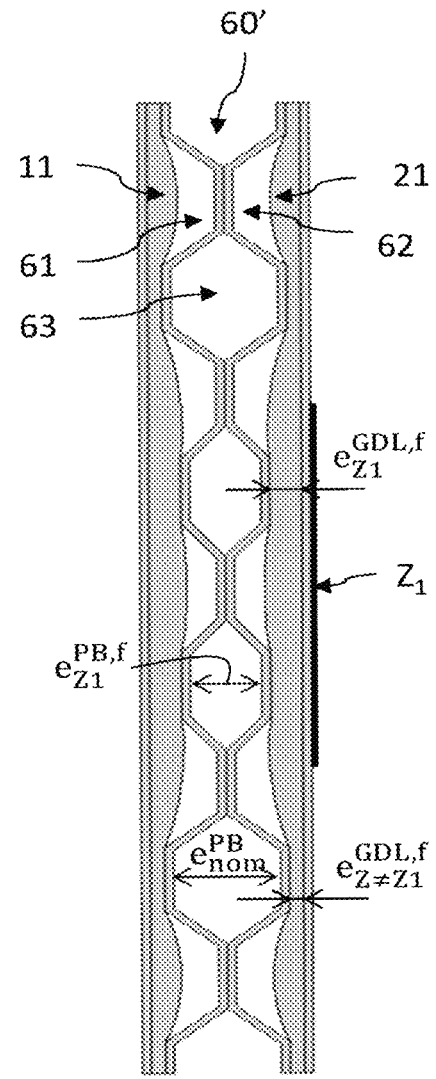

FIG. 6b illustrates the same portion of the cells as that in FIG. 6a; however, in the portion in FIG. 6b the contact resistance Rc has a distribution $Rc_{x,y}^f$ determined by the method according to the invention. Locally, the value $Rc_{Z1}^f$ of the contact resistance is greater than the initial value $Rc_{Z1}^i$ so as to decrease the local production of electrical power and therefore thermal energy. To do this, the mechanical stress of mechanical compression $\sigma_{Z1}^f$ is decreased with respect to its initial value $\sigma_{Z1}^i$ by increasing the local thickness $e_{Z1}^{GDL,f}$ of the diffusion layer via a local modification of the thickness $e_{Z1}^{PB,f}$ of the bipolar plate and more precisely by a decrease, in the zone Z1, of the transverse dimension of the cooling ducts 63 along an axis orthogonal to the mean plane of the cell.

In other words, the following steps may be carried out:

a. a step of identifying at least one zone $Z_i$ of excess temperature in the reference cell, the contact resistance Rc of which has an initial spatial distribution $Rc_{Z1}^i$;

b. a step of determining, using the method according to the invention, the local value $Rc_{Zi}^f$ of the contact resistance Rc in the zone $Z_i$ for which the effective temperature of the cell is substantially equal to a set-point temperature here allowing the excess temperature to be decreased;

c. a step of estimating the local mechanical stress $\sigma_{Zi}^f$ that must be applied to the diffusion layer to obtain the determined local value $Rc_{Zi}^f$, for a clamping load identical to that applied to the reference cell;

d. a step of estimating the local thickness $e_{Zi}^{GDL,f}$ of the diffusion layer that will allow the estimated mechanical stress $\sigma_{Zi}^f$ to be obtained; and e. a step of calculating the local thickness $e_{Zi}^{PB,f}$ of the bipolar plate allowing the estimated thickness $e_{Zi}^{GDL,f}$ to be obtained and then of producing a cell including a bipolar plate the local thickness of which is thus modified.

The local thickness $e_{x,y}^{GDL,f}$ of the diffusion layer allowing the determined value $Rc_{Zi}^f$ of the contact resistance to be obtained may be estimated from experimental measurements linking on the one hand the electrical resistance R to the compressive mechanical stress σ applied to the diffusion layer, and, on the other hand, the compressive stress σ to the thickness $e^{GDL}$ of the diffusion layer. The article by Escribano et al. entitled *Characterization of PEMFCs gas diffusion layers properties*, Journal of Power Sources, 156 (2006) 8-13 demonstrates that the electrical resistance of the cell and the thickness of the diffusion layer vary as a function of applied compressive stress.

Figure 7A:
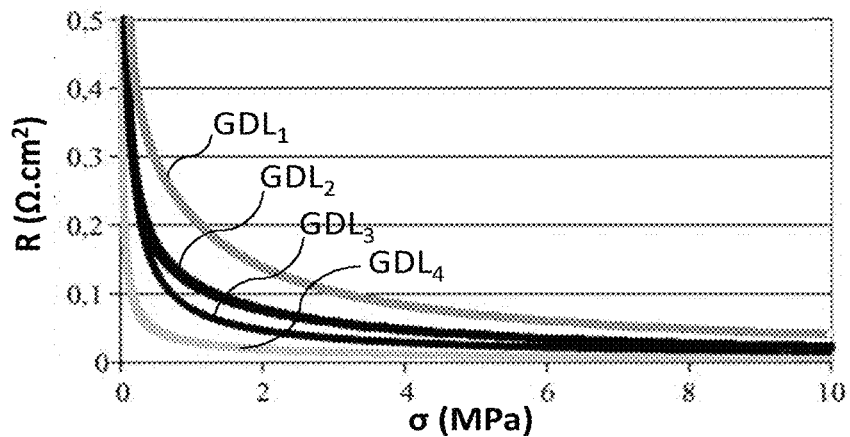
FIG. 7a illustrates examples of relationships between the electrical resistance of an electrochemical cell and the compressive stress applied to the cell, for various types of diffusion layer.

FIG. 7a illustrates an example of the variation in the electrical resistance R of a cell as a function of the applied compressive stress, for various types of diffusion layers, this example being taken from the above 2006 article by Escribano. As indicated by the authors, the variation in the electrical resistance R is representative of that in the contact resistance Rc. Furthermore, since the various ohmic resistances of the cell are known, it is possible to deduce the value of the contact resistance Rc by subtracting these ohmic resistances from the electrical resistance R. By way of example, to locally increase electrical resistance from 8 mΩ·cm² to 24 mΩ·cm², the compressive stress must pass from 2.5 MPa to 0.2 MPa.

Figure 7B:
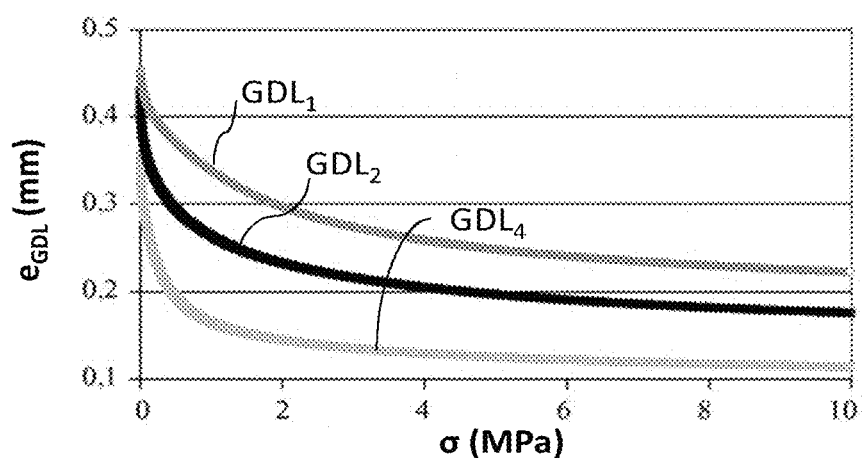
FIG. 7b illustrates examples of relationships between the thickness of an electrochemical-cell diffusion layer and the compressive stress applied to the cell, for various types of diffusion layer.

FIG. 7b illustrates an example of the variation in the thickness of the diffusion layer as a function of the applied compressive stress, for various types of diffusion layers, this example being taken from the above 2006 article by Escribano. Since the mechanical compressive stress $\sigma_{x,y}^f$ to be generated in the diffusion layer is known, it is possible to deduce the thickness $e_{x,y}^{GDL,f}$ of the diffusion layer to be obtained. By way of example, to change the generated compressive stress from 2.5 MPa to 0.2 MPa, the thickness of the diffusion layer must pass from 0.22 mm to 0.32 mm. The bipolar plate is then produced or locally modified so that, once the cell has been assembled and a clamping force identical to that applied to the reference cell has been applied, the local thickness of the bipolar plate in the zone $Z_i$ allows the estimated local thickness of the diffusion layer to be obtained.

More generally, the local thickness of the diffusion layer is increased in a zone $Z_i$ in which the effective temperature of the reference cell is above the set-point temperature and proportionally to the local value of this difference, by decreasing the local thickness of the bipolar plate. This decrease in the thickness of the bipolar plate leads to a decreased compressive stress in the diffusion layer, thereby increasing the local contact resistance Rc and decreasing the local production of electrical power and therefore thermal energy. Conversely, the thickness of the diffusion layer may be increased in another zone $Z_i$ in which the effective temperature of the reference cell is below the set-point temperature and proportionally to the local value of this difference, by increasing the local thickness of the bipolar plate. Thus, this increase in the thickness of the bipolar plate leads to an increased compressive stress in the diffusion layer, thereby decreasing the contact resistance Rc and increasing the local production of electrical power and therefore thermal energy. It will be noted that the variation in the thickness of the bipolar plate also causes the cross section of the channels for distributing the active species to vary, this also inducing a variation in the produced electrical power and therefore thermal energy, which corresponds to the variation in contact resistance.

Thus, an electrochemical cell the structure of which is similar to the reference cell but which is equipped with at least one bipolar plate the thickness of which varies locally, such as described above, allows in operation an effective temperature corresponding to the set-point temperature to be provided, thus advantageously limiting hotspots.

According to a second variant, described with reference to FIG. 8, the thickness of at least one end plate clamping the stack of cells and/or the thickness of a plate 80 inserted in the interior of the stack of cells is adjusted locally so as to modify the compressive mechanical stress applied to the diffusion layer of the electrochemical cells and therefore the contact resistance Rc between each active electrode layer and the adjacent bipolar plate. This adjustment is preferably carried out without modifying the clamping load applied to the cell by the end plates, or modifying the local thickness of the bipolar plates of the electrochemical cells.

Figure 8:
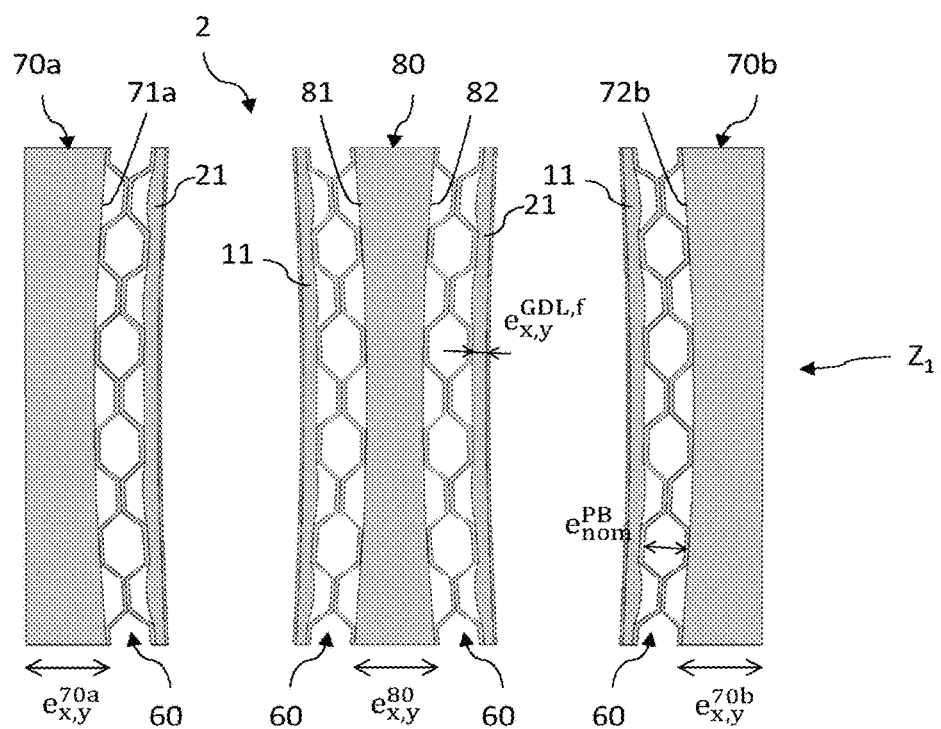
FIG. 8 schematically and partially illustrates an electrochemical reactor including a stack of cells compressed between two surface-structured bipolar plates and including a surface-structured insert.

FIG. 8 partially and schematically illustrates one portion of a stack 2 of electrochemical cells, in which portion the contact resistance Rc has a spatial distribution $Rc_{x,y}^f$ determined using the method described above. Two end plates 70a, 70b and a stack 2 of electrochemical cells clamped between the end plates are shown in this figure. The cells have identical or similar structures and the bipolar plates 60 have here a substantially uniform thickness. At least one of the end plates, here both plates 70a, 70b, has a thickness $e_{x,y}^{70a}$, $e_{x,y}^{70b}$ that varies locally so that the contact resistance of the cells has the determined spatial distribution $Rc_{x,y}^f$. More precisely, each end plate 70a, 70b includes a surface 71a, 72b making contact with the stack of cells, which surface is structured so as to contain locally protuberances or indents, which cause, once the stack of cells has been clamped between the end plates, the compressive stress on the diffusion layers 11, 21 to vary locally, leading to a variation in their local thickness $e_{x,y}^{GDL,f}$ and therefore in the contact resistance $Rc_{x,y}^f$ between each active layer and the adjacent bipolar plate. By protuberance and indent, what is meant is local structuring of the contact surface to respectively form a surface zone that protrudes or is recessed with respect to a main plane that is substantially tangent to the contact surface.

As a variant or in addition, as shown in FIG. 8, an additional plate 80 may be inserted between two adjacent cells in the stack of cells, here between two bipolar plates. Similarly, this insert 80 has a thickness $e_{x,y}^{80}$ that varies locally so as to modify the mechanical stress applied to the diffusion layers and therefore their local thickness $e_{x,y}^{GDL,f}$, causing a consequent variation in local contact resistance $Rc_{x,y}^f$.

More generally, the thickness of at least one end plate and/or of an insert is decreased with respect to a main plane substantially tangent to the contact surface of the plate or of the insert, or locally an indent is produced, in a zone $Z_i$ in which the effective temperature of the reference cell is above the set-point temperature and proportionally to the local value of this difference. Thus, the compressive stress applied to the diffusion layers is decreased and the local thickness thereof is increased. This results in a local increase in contact resistance and therefore in a decrease in the local production of electrical power and therefore thermal energy. Thus, the excess temperature in this zone $Z_i$ is decreased. Similarly to what was described above with reference to FIGS. 7a and 7b, the depth of the indent or the height of the protuberance with respect to a main plane substantially tangent to the contact surface of the plate or insert is determined depending on the estimated thickness of the diffusion layers allowing the determined local value of the contact resistance to be obtained.

Thus, an electrochemical reactor including at least one end plate making contact with a stack of electrochemical cells and/or a plate inserted into the interior of the stack and the thickness of which varies locally, such as described above, allows, in operation, an effective temperature corresponding to the set-point temperature to be provided, thus advantageously limiting hotspots.

As FIGS. 2 and 4 show, at the end of the step of producing the electrochemical cell or an electrochemical reactor so that the electrical contact resistance Rc has the spatial distribution $Rc_{x,y}^{f}$ determined beforehand, a step of measuring the spatial distribution of the effective temperature of the cell in operation is carried out, then the latter is compared to the set-point temperature $T^{C}$. Steps 110, 120; 210, 220 may be reiterated while modifying the properties of the new reference cell and/or while refining the spatial distribution of the set-point temperature, and especially while adjusting the coefficients $K^{i}$ and $K^{\Phi}$. The following steps of the method for determining the distribution of the electrical contact resistance Rc then the step of producing the cell or the electrochemical reactor are then carried out, then a new step of comparing the effective temperature of the cell in operation to the set-point temperature is carried out, until a convergence parameter indicates that this difference is smaller than a preset threshold value.

The invention claimed is:

1. A method for determining a spatial distribution $(Rc_{x,y}^{f})$ of a parameter of interest (Rc) representative of a contact resistance between a given bipolar plate among at least two bipolar plates and an adjacent electrode of an electrochemical cell, said electrochemical cell including two electrodes separated from one another by an electrolyte and placed between the at least two bipolar plates, said electrochemical cell being configured to supply reactive species to the two electrodes and and to remove heat produced by the electrochemical cell in operation, comprising steps of:
  i) providing the electrochemical cell, within which the parameter of interest (Rc) has an initial spatial distribution $(Rc_{x,y}^{i})$ of one or more values of contact resistance, and within which a spatial distribution of a temperature within the electrochemical cell in operation has at least one local temperature value that is greater than or equal to a preset maximum local temperature value;
  ii) defining a spatial distribution $(T_{x,y}^{c})$ of a set-point temperature $(T^{c})$ within the electrochemical cell in operation, said spatial distribution $(T_{x,y}^{c})$ of the set-point temperature $(T^{c})$ within the electrochemical cell in operation being such that local temperature values are lower than preset maximum local temperature values, and such that said spatial distribution $(T_{x,y}^{c})$ of the set-point temperature $(T^{c})$ within the electrochemical cell in operation is such that a local set point temperature gradient is substantially constant;
  iii) measuring a spatial distribution $(D_{x,y}^{r})$ of a first thermal quantity $(D^{r})$ representative of local removal of heat within said electrochemical cell in operation;
  iv) estimating a spatial distribution $(Q_{x,y}^{e})$ of a second thermal quantity $(Q^{e})$ representative of local production of heat within said electrochemical cell in operation, depending on said spatial distribution $(T_{x,y}^{c})$ of the set-point temperature $(T^{c})$ within the electrochemical cell in operation and on said spatial distribution $(D_{x,y}^{r})$ of the first thermal quantity $(D^{r})$ representative of the local removal of heat within said electrochemical cell in operation, so that the spatial distribution of the temperature of said electrochemical cell in operation, the first thermal quantity $(D^{r})$ of the cell having said measured spatial distribution $(D_{x,y}^{r})$ of the first thermal quantity $(D^{r})$ representative of the local removal of heat within said electrochemical cell in operation, and the second thermal quantity $(Q^{e})$ of the cell having said estimated spatial distribution $(Q_{x,y}^{e})$ of the second thermal quantity $(Q^{e})$ representative of the local production of heat within said electrochemical cell in operation, is substantially equal to said spatial distribution $(T_{x,y}^{c})$ of the set-point temperature $(T^{c})$ within the electrochemical cell in operation; and
  v) determining the spatial distribution $(Rc_{x,y}^{f})$ of the parameter of interest (Rc) depending on the estimated spatial distribution $(Q_{x,y}^{e})$ of the second thermal quantity $(Q^{e})$,
  wherein the step (iv) of estimating the spatial distribution $(Q_{x,y}^{e})$ of the second thermal quantity $(Q^{e})$ representative of the local production of heat within said electrochemical cell in operation includes:
    generating a mesh of a cooling circuit of at least one bipolar plate of the among at least two bipolar plates, the cooling circuit being configured to permit flow of a heat-transfer fluid, and
    simulating, numerically by a computer, the second thermal quantity $(Q^{e})$ on said mesh, by solving a discrete numerical model expressing the second thermal quantity $(Q^{e})$ as a function of the at least one local temperature and of the first thermal quantity $(D^{r})$.

2. The method according to claim 1, wherein the parameter of interest (Rc) is an electrical contact resistance of the electrochemical cell, the first thermal quantity $(D^{r})$ is representative of the local removal of the heat produced by the electrochemical cell in operation, and the second thermal quantity $(Q^{e})$ is representative of the local production of heat by the electrochemical cell in operation.

3. The method according to claim 1, wherein the at least two bipolar plates are formed from two sheets that are bonded to each other, each sheet of said two sheets including embossments having an external face defining a circuit configured to distribute the reactive species, the embossments of the sheets together having internal faces, which are opposite the external faces, defining a cooling circuit including cooling channels in fluid communication with one another between an inlet and an outlet of the cooling circuit.

4. The method according to claim 1, wherein the step v) of determining the spatial distribution $(Rc_{x,y}^{f})$ of the parameter of interest (Rc) further depends on a preset overall electrical power value of the electrochemical cell.

5. The method according to claim 1, wherein the first thermal quantity $(D^{r})$ is the measured effective local flow rate of heat-transfer fluid flowing in cooling circuit of at least one bipolar plate of the electrochemical cell, and the second thermal quantity $(Q^{e})$ is the local heat flux produced by the electrochemical cell in operation.

6. The method according to claim 5, wherein the step v) of determining the spatial distribution $(Rc_{x,y}^{f})$ of the parameter of interest (Rc) further includes:
  a) a first sub-step of estimating the spatial distribution $(I^{e})$ of the density of an electrical signal produced by the electrochemical cell in operation, from the estimated spatial distribution $(Q_{x,y}^{e})$ of the local heat flux; and
  b) a second sub-step of determining the spatial distribution $(Rc_{x,y}^{f})$ of the parameter of interest (Rc), from a local density of the electrical signal.

7. A method for producing an electrochemical cell, including steps of:
  i) considering a reference electrochemical cell including two electrodes separated from each other by an electrolyte and placed between bipolar plates configured to supply reactive species to the electrodes and to remove heat produced by the electrochemical cell in operation, the bipolar plates having an initial thickness spatial distribution $(e_{x,y}^{PB,i})$, the electrochemical cell having a parameter of interest (Rc) representative of the electrical contact resistance, said parameter of interest (Rc) being spatially distributed with an initial distribution ($Rc_{x,y}^i$);

ii) determining a spatial distribution ($Rc_{x,y}^f$) of the parameter of interest (Rc), using the method according to claim 1; and iii) producing said electrochemical cell from the reference electrochemical cell such that the parameter of interest (Rc) has the determined spatial distribution ($Rc_{x,y}^f$).

8. The method for producing an electrochemical cell according to claim 7, wherein a thickness spatial distribution ($e_{x,y}^{PB,f}$) of a thickness of at least one of the bipolar plates is determined depending on the determined spatial distribution ($Rc_{x,y}^f$).

9. The method for producing an electrochemical cell according to claim 8, wherein said at least one of the bipolar plates has a local thickness $e_{x,y}^{PB,f}$ different than a nominal plate thickness substantially equal to an initial thickness $e_{x,y}^{PB,f}$ of said at least one of the bipolar plates in zones identified using said determined spatial distribution ($Rc_{x,y}^f$) of the electrical contact resistance.

10. A method for producing an electrochemical reactor, including steps of:

i. considering a reference electrochemical reactor including a stack of electrochemical cells clamped and compressed between two end plates, each of the electrochemical cells comprising two electrodes separated from each other by an electrolyte and placed between bipolar plates configured to supply reactive species to the electrodes and to remove heat produced by said each cell in operation, and having a parameter of interest (Rc) representative of the electrical contact resistance, said parameter of interest (Rc) being spatially distributed with an initial distribution ($Rc_{x,y}^i$);

ii. determining a spatial distribution ($Rc_{x,y}^f$) of the parameter of interest (Rc) for at least one of the cells using the method according to claim 1; and iii. producing said electrochemical reactor from the reference electrochemical reactor such that the parameter of interest (Rc) has the determined spatial distribution ($Rc_{x,y}^f$).

11. The method for producing an electrochemical reactor according to claim 10, wherein a thickness spatial distribution ($e_{x,y}^{70a,70b}$) of a thickness of at least one of the end plates, and/or a thickness spatial distribution ($e_{x,y}^{80}$) of a thickness of at least one end plate inserted between two adjacent electrochemical cells of said stack, is determined depending on the determined spatial distribution ($Rc_{x,y}^f$).

12. A nontransitory data storage medium containing instructions, which when run on a processor, cause the processor to perform a method according to claim 1.

* * * * *